United States Patent
Iwakura et al.

(10) Patent No.: US 8,221,177 B2
(45) Date of Patent: Jul. 17, 2012

(54) ORGANIC EL PANEL INCLUDING AN ELEMENT SUBSTRATE DEHYDRATED IN A SHORTER TIME AND METHOD FOR MANUFACTURING THE SAME

(75) Inventors: Yasushi Iwakura, Kawasaki (JP); Katsunori Oya, Yokohama (JP); Takuro Yamazaki, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 439 days.

(21) Appl. No.: 11/851,490

(22) Filed: Sep. 7, 2007

(65) Prior Publication Data

US 2008/0203906 A1    Aug. 28, 2008

(30) Foreign Application Priority Data

Feb. 28, 2007  (JP) .................. 2007-049370

(51) Int. Cl.
*H01J 9/00* (2006.01)
(52) U.S. Cl. ......................................................... 445/24
(58) Field of Classification Search ........................ None
See application file for complete search history.

(56) References Cited

U.S. PATENT DOCUMENTS

| | | | | |
|---|---|---|---|---|
| 6,633,121 B2 | 10/2003 | Eida et al. | ............. | 313/504 |
| 7,034,456 B2 * | 4/2006 | Yamazaki et al. | ............. | 313/506 |
| 7,150,669 B2 | 12/2006 | Abe et al. | | |
| 2001/0050532 A1 | 12/2001 | Eida et al. | ............. | 313/504 |
| 2004/0217695 A1 | 11/2004 | Yoneda et al. | ............. | 313/504 |
| 2005/0030258 A1 * | 2/2005 | Satake | ............. | 345/55 |
| 2005/0082966 A1 * | 4/2005 | Yamazaki et al. | ............. | 313/498 |
| 2005/0218396 A1 * | 10/2005 | Tsuchiya et al. | ............. | 257/13 |
| 2007/0108889 A1 | 5/2007 | Kim | ............. | 313/503 |
| 2007/0222382 A1 | 9/2007 | Yamazaki et al. | | |
| 2007/0259588 A1 * | 11/2007 | Masumo | ............. | 445/25 |
| 2007/0273271 A1 | 11/2007 | Yamazaki et al. | | |

FOREIGN PATENT DOCUMENTS

| | | |
|---|---|---|
| JP | 2003-332069 | 11/2003 |
| JP | 2003332058 | 11/2003 |
| JP | 2004-071554 | 3/2004 |
| JP | 2007-141838 | 6/2007 |
| WO | WO 01/58221 A1 | 8/2001 |

OTHER PUBLICATIONS

Japanese Office Action issued in the corresponding counterpart application No. 2007-049370 (3 pages).

* cited by examiner

*Primary Examiner* — Anh Mai
*Assistant Examiner* — Britt D Hanley
(74) *Attorney, Agent, or Firm* — Fitzpatrick, Cella, Harper & Scinto

(57) ABSTRACT

An organic EL panel is produced with high productivity by a method in which a first protective film (planarizing layer) can be dehydrated in a shorter time without increasing the number of steps up to the step of forming a second protective film (separation film). The second protective film has regions at which the first protective film is exposed between first electrodes.

4 Claims, 7 Drawing Sheets

ORGANIC EL PANEL INCLUDING AN ELEMENT SUBSTRATE DEHYDRATED IN A SHORTER TIME AND METHOD FOR MANUFACTURING THE SAME

BACKGROUND OF THE INVENTION

1. Field of the Invention

The present invention relates to organic EL panels, and particularly to an organic EL panel including an element substrate dehydrated at a shorter time and to a method for manufacturing the same.

2. Description of the Related Art

General organic EL elements that have recently been developed have a fundamental multilayer structure of an anode, an organic layer including at least a light-emitting layer, and a cathode. Light emitted from the light-emitting layer is extracted across a substrate, such as a glass plate, using a transparent anode formed on the substrate. In addition, active matrix panels that have driving transistors for each light-emitting pixel have been increasingly studied.

As the demand for high-definition images and low power consumption grow, it is expected that a low-cost, high-quality active matrix organic EL panel will be placed into practical use.

Figure 1:
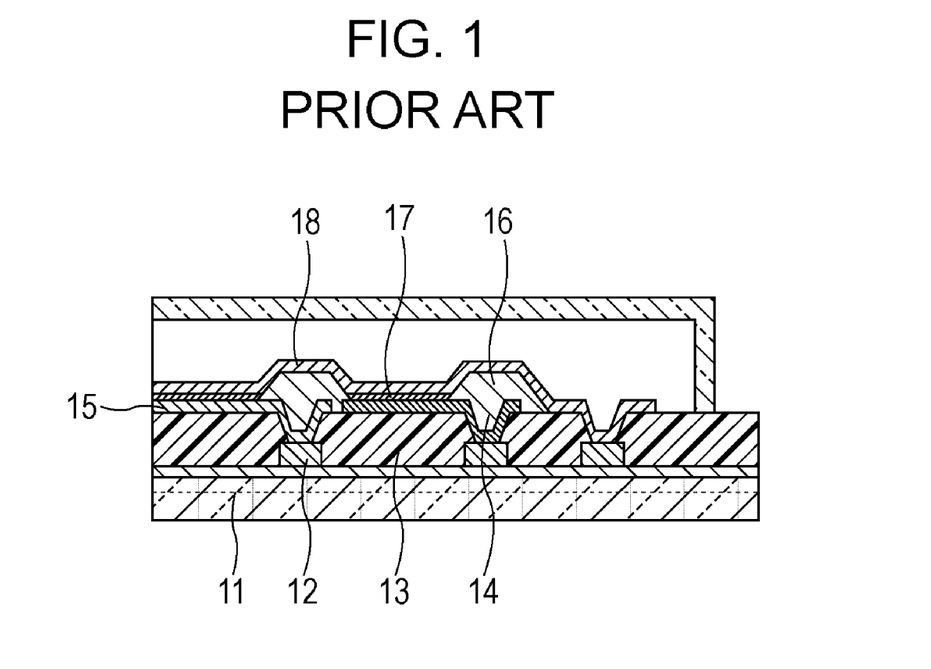
FIG. 1 is a schematic diagram of a prior art active matrix organic EL panel.

FIG. 1 is a schematic view of a typical conventional structure of an active matrix organic EL panel. As shown in FIG. 1, the active matrix organic EL panel has a plurality of transistors 12 on a substrate 11. A planarizing layer 13 is formed on the transistors 12. A plurality of anodes 15 are connected to the respective transistors 12 through contact holes 14, and a separation film 16 covers the edges of the anodes, defining apertures for the anodes. Furthermore, an organic layer including at least a light-emitting layer 17 and then a cathode 18 are formed over the separation film 16. A current controlled by the drive circuit of each transistor is supplied to the corresponding anode and delivered to the light-emitting layer and the cathode. Electroluminescence is thus produced.

The planarizing layer 13 covers the unevenness of 0.1 to 1 μm in height resulting from the formation of the plurality of transistors 12 and maintains a smooth surface of the element substrate.

The planarizing layer 13 is formed of an organic resin, such as acrylic resin, by spin coating.

The separation film 16 is intended to protect the edges of the patterned anodes 15, and is formed of an organic resin, such as polyimide resin, by spin coating.

Alternatively, the separation film 16 may be formed of an electrically insulating inorganic material, such as silicon nitride, silicon oxide, SiON, or aluminum oxide by magnetron sputtering, high-frequency ion plating, chemical vapor deposition (CVD), or the like.

It has been known that organic EL elements are not water-resistant. The organic materials used for the organic EL element are liable to be decomposed or altered by water or solvents and, consequently, can result in problems, such as occurrence of a dark spot or decrease in luminance around pixel edges or during high temperature storage.

Furthermore, if the planarizing layer 13 is formed of an organic resin, then the layer 13 contains a relatively large amount of water after being spin coated and patterned. In addition, more water is added to the planarizing layer 13 when patterning the pixel electrodes, or the anodes 15, on the planarizing layer.

If the light-emitting layer is formed on the hydrated planarizing layer 13, the light-emitting layer absorbs water, and consequently, a dark spot occurs or the luminance is reduced.

It is, therefore, required that dehydration of the planarizing layer 13 be performed by baking it at a high temperature before forming the light-emitting layer (Japanese Patent Laid-Open No. 2003-332058).

Unfortunately, in order to prevent reductions in luminance of the organic EL element, dehydration needs to be conducted for a sufficient time. Accordingly, a prolonged dehydration step is disadvantageous to productivity.

The dehydration of the planarizing layer is prolonged due to the presence of the metal electrode or anodes over the planarizing layer which blocks the primary route of dehydration.

If the separation films are formed of an organic material, the water exiting the planarizing layer enters the separation films through small areas of the planarizing layer in contact with the separation films and passes through the separation film to escape. Thus, the dehydration step is further prolonged.

If the separation film is formed of an electrically insulating inorganic material, such as silicon nitride, silicon oxide, SiON, or aluminum oxide, it is more difficult to transmit the water through the separation film than the case in which an organic separation film is used. Hence, the dehydration of the planarizing layer is even more difficult when employing an insulative inorganic material. Furthermore, the confined water transiting the separation film may expand and crack the separation film.

SUMMARY OF THE INVENTION

The present invention provides an organic EL panel including a planarizing layer that has been dehydrated in an acceptable time without increasing the number of steps prior to forming a separation film and a method for manufacturing the same with a high productively. The resulting organic EL panel is less affected by water.

According to an aspect of the invention, an organic EL panel is provided which includes a substrate, a plurality of transistors disposed on the substrate, a first protective film made of an organic material disposed on the transistors, a plurality of first electrodes electrically connected to the respective transistors through contact holes, a second protective film covering the edges of the first electrodes, an organic layer disposed over the first electrodes, and a second electrode disposed on the organic layer. The second protective film has regions at which the first protective film is exposed between the first electrodes adjacent to each other.

According to another aspect of the invention, a method for manufacturing an organic EL panel is provided which includes the steps of: forming a plurality of transistors on a substrate; forming a first protective film on the transistors; forming a plurality of first electrodes connected to the respective transistors through contact holes; forming a second protective film to cover the edges of the first electrodes; forming an organic layer over the first electrodes; and forming a second electrode on the organic layer. The step of forming the second protective film includes the sub-step of defining regions at which the first protective film is exposed between the first electrodes adjacent to each other.

The first electrodes and the second protective film acting as a separation film are patterned in such a manner that the first protective film acting as a planarizing layer is partially exposed.

Consequently, the planarizing layer can be more efficiently dehydrated, preventing the first electrodes or the separation film from blocking the route of dehydration, even if the planarizing layer is made of a material that can absorb a large amount of water, such as acrylic resin.

Thus, the dehydration time can be reduced without reducing productivity, and the resulting organic EL panel is less affected by water.

Further features of the present invention will become apparent from the following description of exemplary embodiments with reference to the attached drawings.

DESCRIPTION OF THE EMBODIMENTS

An organic EL panel according to an embodiment of the present invention includes, on a substrate, a plurality of transistors, a first protective film formed of an organic material on the transistors, a plurality of first electrodes electrically connected to the respective transistors through contact holes; a second protective film covering the edges of the first electrodes, an organic layer formed over the first electrodes, and a second electrode formed over the organic layer. The second protective film has regions at which the first protective film is exposed between the first electrodes adjacent to each other.

Consequently, the water contained in the first protective film can be directly removed by dehydration before forming the organic layer, without being blocked by the first electrodes or the second protective film. Thus, a larger amount of water can be removed, and the resulting organic EL panel is less affected by water.

The organic EL panel according to this embodiment can be manufactured by a method including the steps of: forming the plurality of transistors on the substrate; forming the first protective film over the transistors; forming the plurality of first electrodes electrically connected to the respective transistors through the contact holes; forming the second protective film to cover the edges of the first electrodes; forming the organic layer over the first electrodes; and forming the second electrode over the organic layer. The step of forming the second protective film includes the sub-step of defining the regions at which the first protective film is exposed between the first electrodes adjacent to each other.

Consequently, the water contained in the first protective film can be directly removed by dehydration before forming the organic layer, without being blocked by the first electrodes or the second protective film. Thus, a larger amount of water can be removed in a short time, and the speed of production of the organic EL panel can be increased. The organic EL panel manufacturing method of this embodiment may further include the step of covering the regions in the second protective film, after dehydrating the first protective film. The step of forming the organic layer including a light-emitting layer may be performed after the step of covering the regions in the second protective film.

Examples of the organic EL panel according to the embodiment will be described below.

EXAMPLE 1

Figure 2:
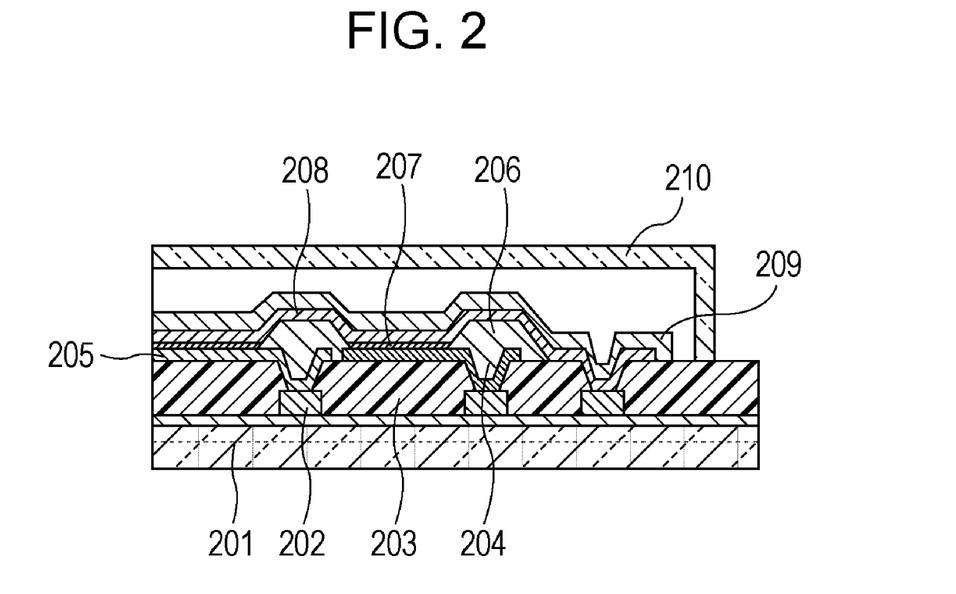
FIG. 2 is a fragmentary schematic sectional view of an organic EL panel according to an embodiment of the present invention.

FIG. 2 is a schematic sectional view of the organic EL panel used in Example 1, including a glass substrate 201, transistors 202, a first protective film (planarizing layer) 203, contact holes 204, first electrodes 205, a second protective film (separation film) 206, an organic layer 207, a second electrode 208, and a glass seal cap 210.

Figure 3A:
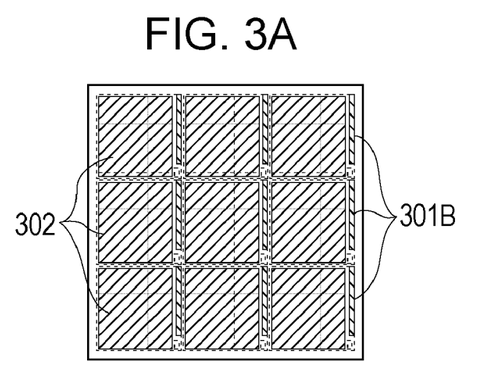
FIGS. 3A to 3D are schematic plan views of an element substrate, a first protective film, first electrodes and a second protective film of an organic EL panel of Example 1, respectively.
Figure 3B:
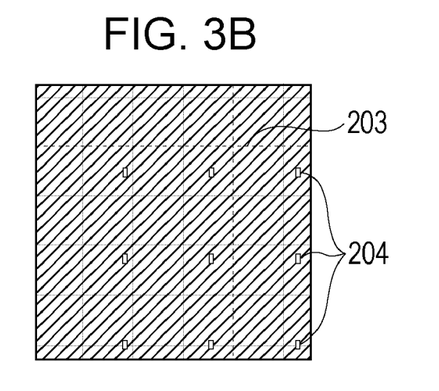
Figure 3C:
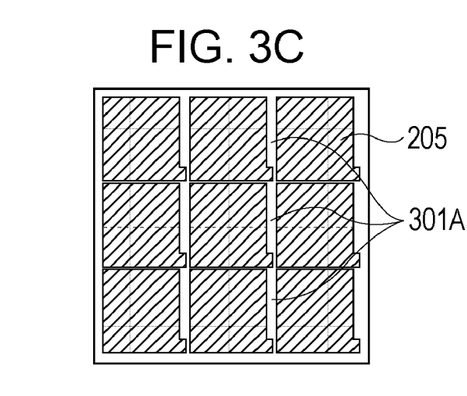
Figure 3D:
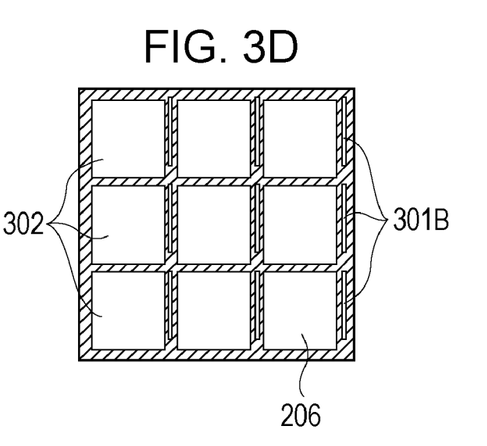

FIG. 3A is a schematic plan view of the element substrate (including each layer or film) of Example 1; FIG. 3B is a schematic diagram of the pattern of the first protective film; FIG. 3C is a schematic diagram of the pattern of the first electrodes; and FIG. 3D is a schematic diagram of the pattern of the second protective film. Reference numerals 301A and 301B designate exposed regions and reference numeral 302 designates pixel apertures.

Figure 4:
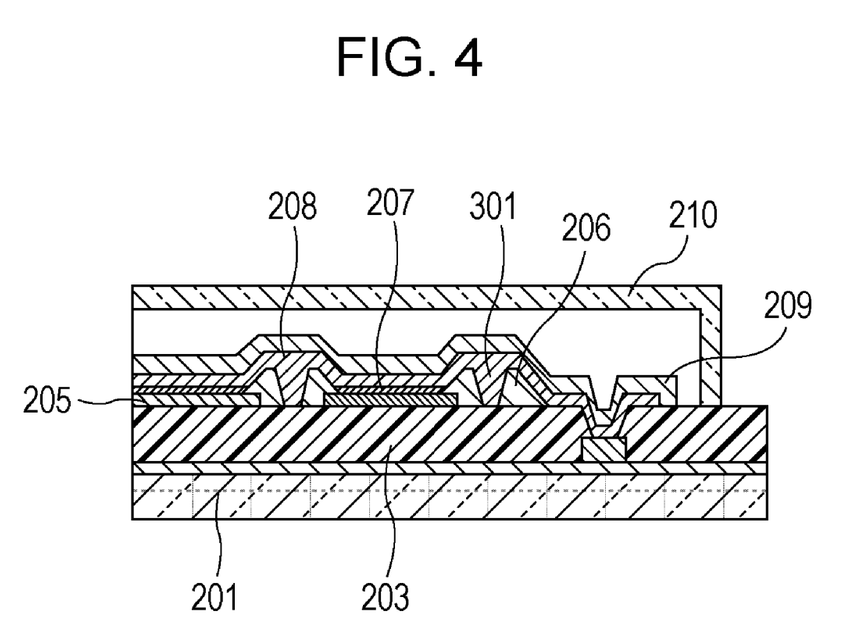
FIG. 4 is a fragmentary schematic sectional view of the organic EL panel of Example 1.

FIG. 4 is a fragmentary schematic sectional view of the organic El panel of the Example 1 taken along a line passing across the exposed regions 301A.

The element substrate used in Example 1 had a pixel matrix of 160 by 120 dots and a pixel length and width of 0.25 mm by 0.25 mm.

The plurality of transistors 202 for driving the organic EL elements were formed on the glass substrate 201. The transistors 202 were coated with the first protective film 203 of an acrylic resin by spin coating to planarize the unevenness of the transistors 202. Then, the first protective film 203 was patterned as shown in FIG. 3B. Chromium was deposited to form the first electrodes 205 on the portions of the patterned first protective film 203 by DC magnetron sputtering. Since an acrylic resin is suitable to maintain flatness, the first protective film is often formed of an acrylic resin. However, an acrylic resin easily absorbs water and, accordingly, the first protective film contains a relatively large amount of water after being coated.

Then, the first electrodes 205 were formed by patterning as shown in FIG. 3C. The first electrodes 205 were coated with a polyimide resin by spin coating to form the second protective film 206. Although a polyimide resin does not deposit as flat as an acrylic resin, the water absorption of the polyimide is only about 1/10 of the acrylic resin. The polyimide resin is therefore suitable for the second protective film, which is not required to maintain the flatness of the first protective film. Subsequently, the second protective film 206 was patterned. Patterning steps in Example 1 were each performed by general photolithography.

The first electrodes 205 were each provided with an exposed region 301A at which the first protective film 203 was exposed. The exposed regions are adjacent to the contact holes 204 for electrical contact with the transistors 202. The second protective film 206 was also provided with exposed regions 301B smaller than the exposed regions 301A corresponding to the exposed regions 301A in the same manner. Thus, the pixel aperture ratio can be maintained because of the use of regions adjacent to the contact holes 204 and independent of the pixel apertures 302. The portions of the acrylic resin of the first protective film 203 exposed at the exposed regions 301B releases water faster than the regions of the acrylic resin in contact with the polyimide resin of the second protective film 206, which film absorbs water less than the acrylic resin. Thus, the water in the acrylic resin exhibiting high water absorption can be removed in a shorter time in a dehydration step. This process can provide a route for removing the water contained in the first protective film 203 without requiring an additional patterning step, and, accordingly, productivity is not reduced.

After the above steps were completed, dehydration was performed in a vacuum high-temperature furnace under a reduced pressure of 10 Pa at a furnace temperature of 200° C. (high temperature) for 0.5 to 3 hours. Then, the element substrate was exposed to UV light for about 10 minutes in a dried air atmosphere. If the second protective film (separation film) was formed of an organic material such as polyimide, as above, the water contained in the second protective film can be simultaneously removed in the step of dehydrating the first protective film (planarizing layer).

Then, the organic layer 207 including a hole injection layer, a light-emitting layer, an electron transport layer, and an electron injection layer was formed in a vacuum deposition chamber by resistance heating vapor deposition. The total thickness of the organic layer 207 was 120 nm. Subsequently, the second electrode 208 was formed of ITO to a thickness of about 100 nm by DC magnetron sputtering. A vapor barrier 209 was further formed of silicon nitride ($SiN_x$) to a thickness of about 1 μm by chemical vapor deposition (CVD).

The resulting element substrate was transferred into a glove box filled with dried nitrogen gas in which the dew point was set at −70° C. or less without being exposed to air. In the glove box, a UV-curable resin was applied onto the region around the display region and a glass seal cap 210 from which water had been removed in advance was bonded to the element substrate. The region of the UV-curable rein was exposed to UV light to be cured. Thus, the organic EL panel was completed with the seal space filled with dried nitrogen.

Thus an organic EL panel can be produced at high productivity by a process in which the time for dehydrating the planarizing layer can be reduced without increasing the number of steps prior to the step of forming the separation film.

COMPARATIVE EXAMPLE

Figure 5A:
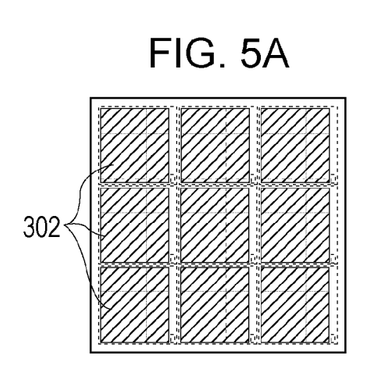
FIGS. 5A to 5D are schematic plan views of an element substrate, a first protective film, first electrodes and a second protective film of an organic EL panel of the Comparative Example, respectively.
Figure 5B:
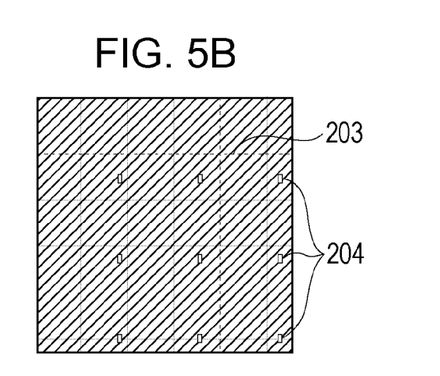
Figure 5C:
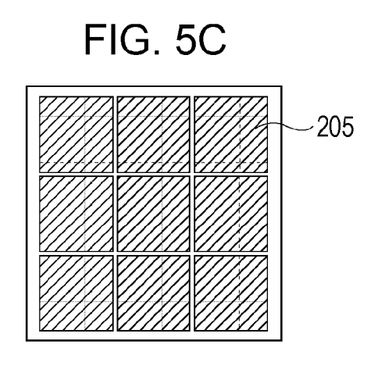
Figure 5D:
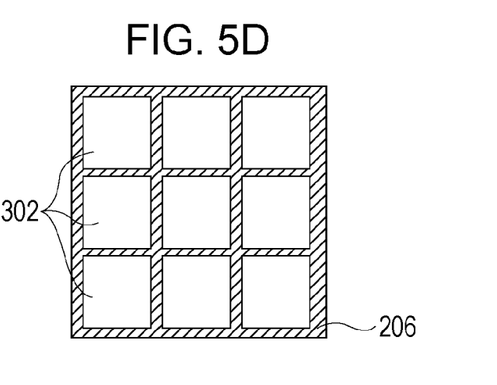

An organic EL panel of a Comparative Example was produced in the same manner as in Example 1, except that the first electrodes 205 and the second protective film 206 were patterned with different exposure masks. FIGS. 5B, 5C, and 5D show patterns of the first protective film 203, first electrodes 205 and second protective film 206 of the Comparative Example, respectively.

Figure 6:
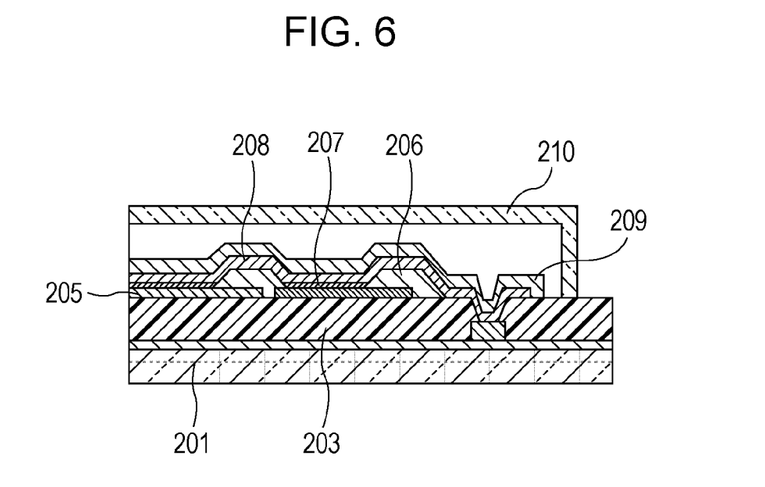
FIG. 6 is a fragmentary schematic sectional view of the organic EL panel of the Comparative Example.

FIG. 6 is a fragmentary schematic sectional view of the organic EL panel of the Comparative Example. The section shown in FIG. 6 corresponds to the section shown in FIG. 4.

The organic EL panels produced in Example 1 and the Comparative Example were operated to emit light in a high-temperature furnace under atmospheric pressure at 80° C., and the elapsed time until the luminance was reduced by 10% from the initial luminance of emitted light was evaluated. In this instance, the driving current density of each element substrate was adjusted to 0.3 $mA/mm^2$. The results are shown in FIG. 7.

Figure 7:
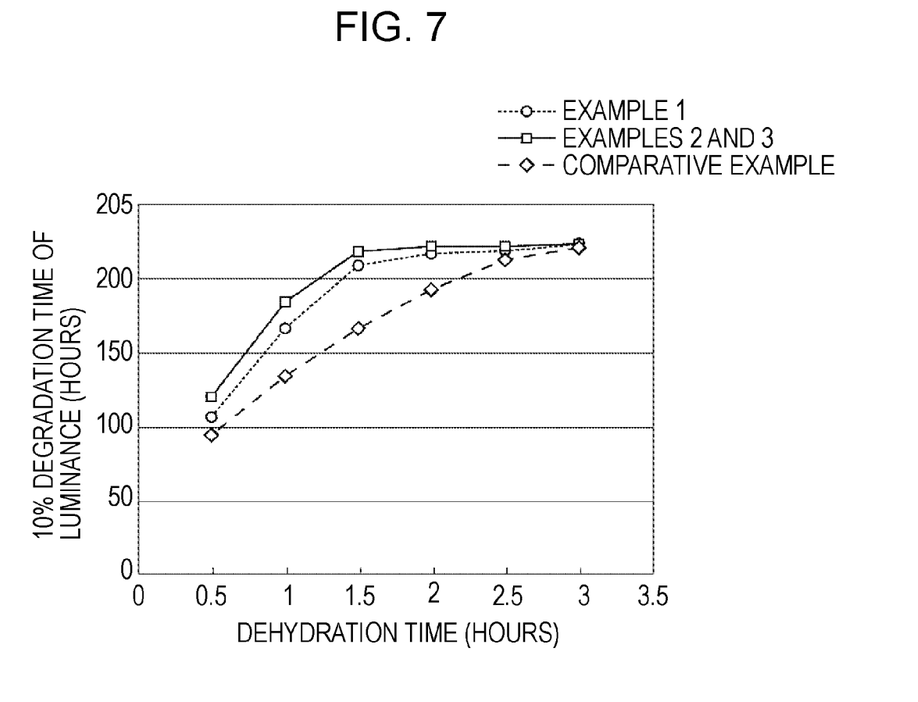
FIG. 7 is a plot of evaluation results.

As shown in FIG. 7, while it took 3 hours or more to saturate the 10% degradation time of luminance in the Comparative Example, it took about 2 hours in Example 1. Thus the process of Example 1 can reduce the dehydration time.

EXAMPLE 2

Figure 8A:
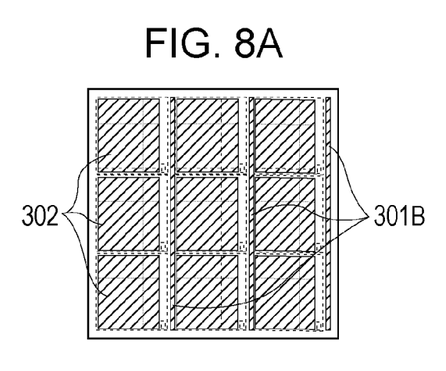
FIGS. 8A to 8D are schematic plan views of an element substrate, a first protective film, first electrodes and a second protective film of an organic EL panel of Example 2, respectively.
Figure 8B:
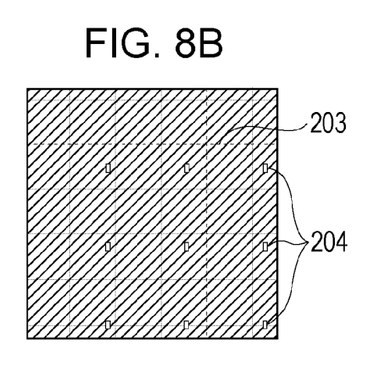
Figure 8C:
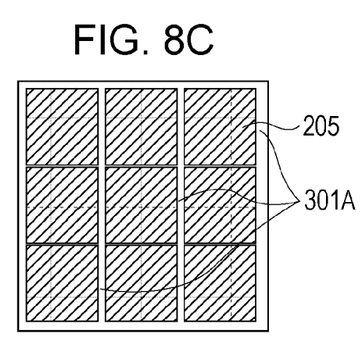
Figure 8D:
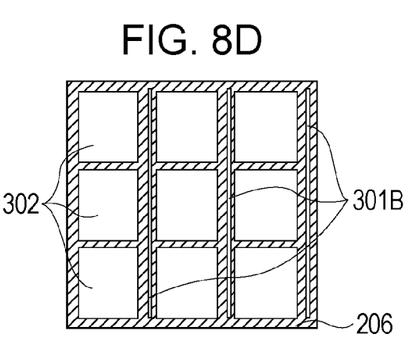

An organic EL panel of Example 2 was produced in the same manner as in Example 1, except that the first protective film 203, the first electrodes 205, and the second protective film 206 were patterned using different exposure masks. FIGS. 8B, 8C, and 8D show patterns of the first protective film 203, first electrodes 205 and second protective film 206 of Example 2, respectively.

As shown in FIGS. 8A to 8D, each exposed region 301B for the first protective film 203 extends in a long line so that the dehydration time would be reduced because of the larger exposed area than in Example 1. As shown in FIG. 7 together with the results of evaluation of Example 1, the dehydration time until the 10% degradation time of luminance was saturated was reduced to 1.5 hours in comparison with Example 1. However, the organic EL panel of Example 2 exhibited a lower pixel aperture ratio than that of Example 1. When the panel of Example 2 was operated under the same conditions as in Example 1, the luminance was slightly weakened.

Thus an organic EL panel can be produced with high productivity by a process in which the time for dehydrating the planarizing layer can be reduced.

EXAMPLE 3

In Example 3, the second protective film 206 was formed of an electrically insulating inorganic material.

Figure 9A:
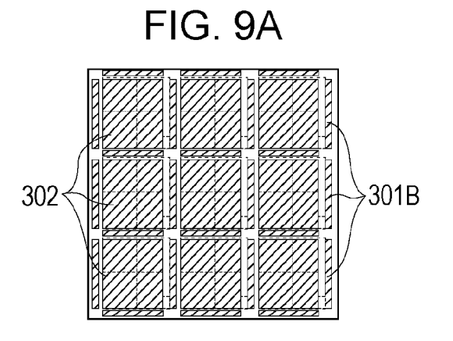
FIGS. 9A to 9D are schematic plan views of an element substrate, a first protective film, first electrodes and a second protective film of an organic EL panel of Example 3, respectively.
Figure 9B:
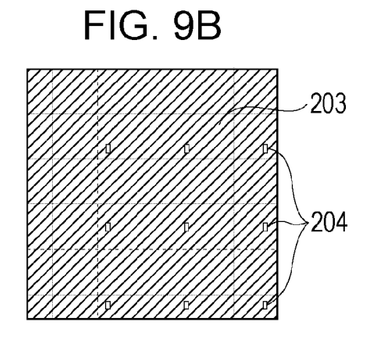
Figure 9C:
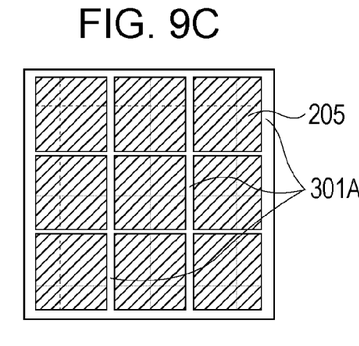
Figure 9D:
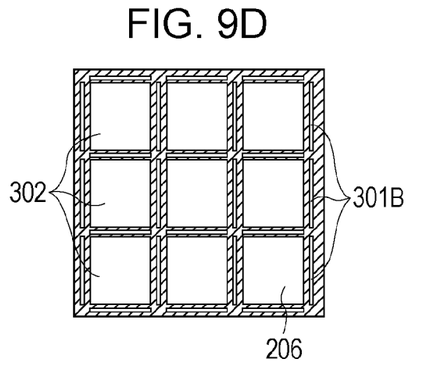

FIGS. 9B, 9C, and 9D show patterns of the first protective film 203, first electrodes 205 and second protective film 206 of Example 3, respectively.

As shown in FIGS. 9A to 9D, each exposed region 301B for the first protective film 203 was formed so as to surround the pixels between each two adjacent pixels.

The water remaining in the planarizing layer may vaporize to expand depending on the conditions in the dehydration step described below, consequently cracking the second protective film 206.

Accordingly, the exposing regions were formed along the sides of each rectangular first electrode 205 to facilitate the removal of the remaining water from the planarizing layer underlying the first electrodes 205. In addition, by forming the exposed regions along the sides of the first electrodes 205, the total area of the exposed regions is increased to facilitate the removal of the water, and to also prevent stress from being concentrated on a side.

Consequently, the second protective film 206 can be prevented from cracking.

Although the first electrodes were formed in a rectangular shape in Example 3, they can be formed in any shape without being limited to rectangle as long as they are polygon-shaped, such as parallelogram, trapezoid, triangle, or hexagon.

The procedure from the step of forming the transistors 202 on the glass substrate 201 to the step of forming the first electrodes 205 was performed in the same manner as in Example 2.

Then, silicon nitride ($SiN_x$) was deposited to form the second protective film 206 on the first electrodes by CVD.

Alternatively, the second protective film 206 may be formed of other electrically insulating inorganic material, such as silicon oxide, SiON, or aluminum oxide. The formation of the second protective film 206 may be performed by any other deposition, such as magnetron sputtering or high-frequency ion plating, as long as a dense film without defects can be formed.

The protective film 206 was then patterned as shown in FIG. 9D.

The subsequent steps were performed in the same manner as in Example 2, from the step of dehydration in a high-temperature vacuum furnace to the step of bonding the glass seal cap 210.

The resulting organic EL panel was evaluated in the same manner as in Examples 1 and 2. The results are shown in FIG. 7. It took about 1.5 hours to saturate the 10% degradation time of luminance, as in Example 2.

Thus an organic EL panel can be produced with high productivity by a process in which the time for dehydrating the planarizing layer can be reduced.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims the benefit of Japanese Application No. 2006-091227 filed Mar. 29, 2006 and No. 2007-049370 filed Feb. 28, 2007, which are hereby incorporated by reference herein in their entirety.

What is claimed is:

1. A method for manufacturing an organic EL panel, the method comprising the steps of:
    forming a plurality of transistors on a substrate;
    forming a first protective film of organic material on the transistors;
    forming a plurality of first electrodes connected to the respective transistors through contact holes in the first protective film; and
    forming a second protective film to cover the edges of the first electrodes, including the sub-steps of:
        forming a first aperture between adjacent first electrodes for exposing a part of the first electrodes and a second aperture for exposing the surface of the first protective film;
    removing water contained in the first protective film by a dehydrating step after forming the second protective film;
    forming an organic layer over the first electrodes; and
    forming a second electrode on the organic layer.

2. The method according to claim 1, wherein the first protective film is formed of an acrylic resin and the second protective film is formed of a polyimide resin.

3. The method according to claim 1, wherein the first protective film is formed of an acrylic resin and the second protective film is formed of an electrically insulating inorganic material.

4. The method according to claim 1, wherein the dehydration step is performed under a reduced pressure at a high temperature.

* * * * *